(12) United States Patent
Armgarth et al.

(10) Patent No.: US 6,587,250 B2
(45) Date of Patent: Jul. 1, 2003

(54) ELECTROCHROMIC DEVICE

(75) Inventors: Mårten Armgarth, Linköping (SE); Thomas Kugler, Linghem (SE); Rolf M. Berggren, Vreta Kloster (SE); Tommi M. Remonen, Nyköping (SE)

(73) Assignee: Acreo AB, Kista (SE)

( * ) Notice: Subject to any disclaimer, the term of this patent is extended or adjusted under 35 U.S.C. 154(b) by 0 days.

(21) Appl. No.: 10/091,399

(22) Filed: Mar. 7, 2002

(65) Prior Publication Data

US 2002/0126365 A1 Sep. 12, 2002

Related U.S. Application Data

(60) Provisional application No. 60/276,105, filed on Mar. 16, 2001.

(30) Foreign Application Priority Data

Mar. 7, 2001 (SE) .............................................. 0100747

(51) Int. Cl.⁷ ................................................ G02F 1/15
(52) U.S. Cl. ...................... 359/265; 359/269; 359/270; 359/275
(58) Field of Search ................................ 359/265–270, 359/273, 275; 546/257; 544/347; 204/290.07; 252/583, 600

(56) References Cited

U.S. PATENT DOCUMENTS

| | | | |
|---|---|---|---|
| 4,993,810 A | * | 2/1991 | Demiryont .................. 359/265 |
| 5,138,481 A | * | 8/1992 | Demiryont .................. 359/269 |
| 5,444,330 A | | 8/1995 | Leventis et al. |
| 5,446,577 A | | 8/1995 | Bennett et al. |
| 5,742,424 A | | 4/1998 | Coleman |
| 5,754,329 A | | 5/1998 | Coleman |
| 5,812,300 A | | 9/1998 | Coleman |
| 5,877,888 A | | 3/1999 | Coleman |
| 6,118,572 A | * | 9/2000 | Kostecki et al. ............ 359/270 |
| 6,175,441 B1 | | 1/2001 | Heuer et al. |
| 6,194,072 B1 | | 2/2001 | Hambitzer et al. |

FOREIGN PATENT DOCUMENTS

WO    WO 94/15246    7/1994

* cited by examiner

Primary Examiner—Loha Ben
Assistant Examiner—M. Hasan
(74) Attorney, Agent, or Firm—Burns, Doane, Swecker & Mathis, L.L.P.

(57) ABSTRACT

A supported or self-supporting electrochromic device is provided having (a) at least one electrochromic element comprising (i) at least one material that is electrically conducting in at least one material that is electrically conducting in at least one oxidation state and (ii) at least one electrochromic material, wherein said materials (i) and (ii) can be the same or different, (b) at least one layer of a solidified electrolyte which is in direct electrical contact with said electrochromic element, and (c) at least two electrodes adapted to be electrically connected to a voltage supply so as to create a difference in potential therebetween, with each of said electrodes being in direct electrical contact with at least one of said electrolyte layer(s) and not in direct electrical contact with said electrochromic element. Displays incorporating such a device, as well as processes for the production of such a device are contemplated. A method for addressing an electrochemically active element also is provided.

42 Claims, 13 Drawing Sheets

: Colour A

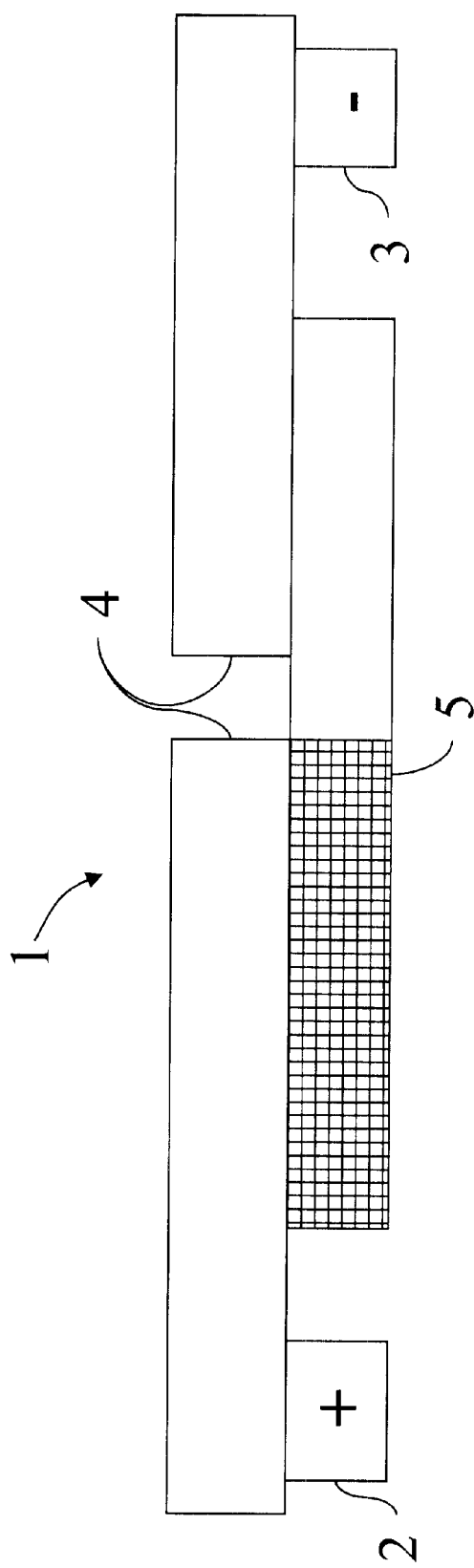
FIGURE 4A
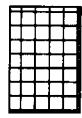 : Colour A

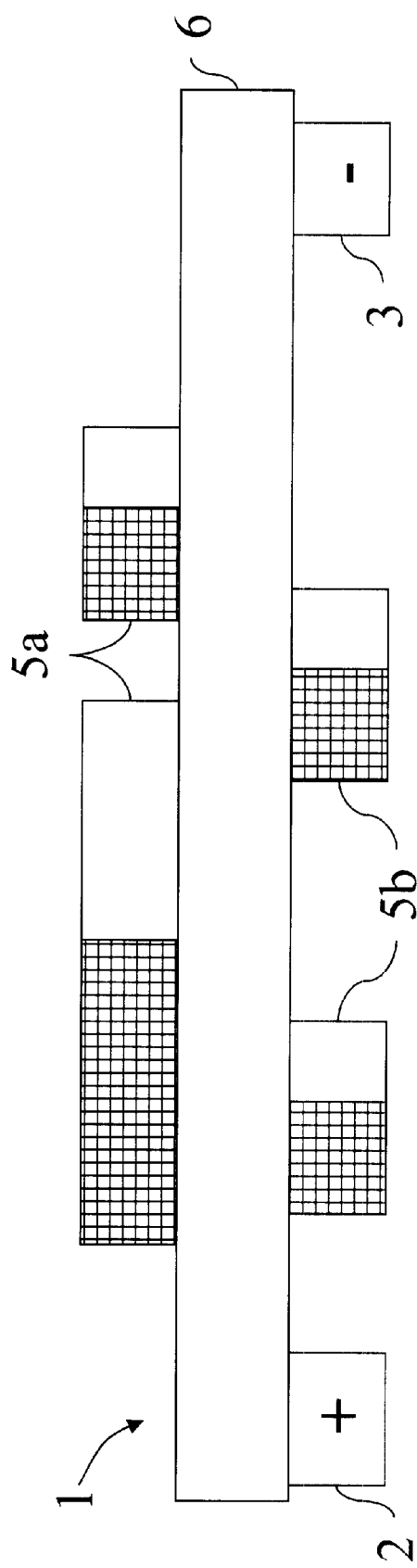
FIGURE 6
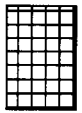  : Colour A

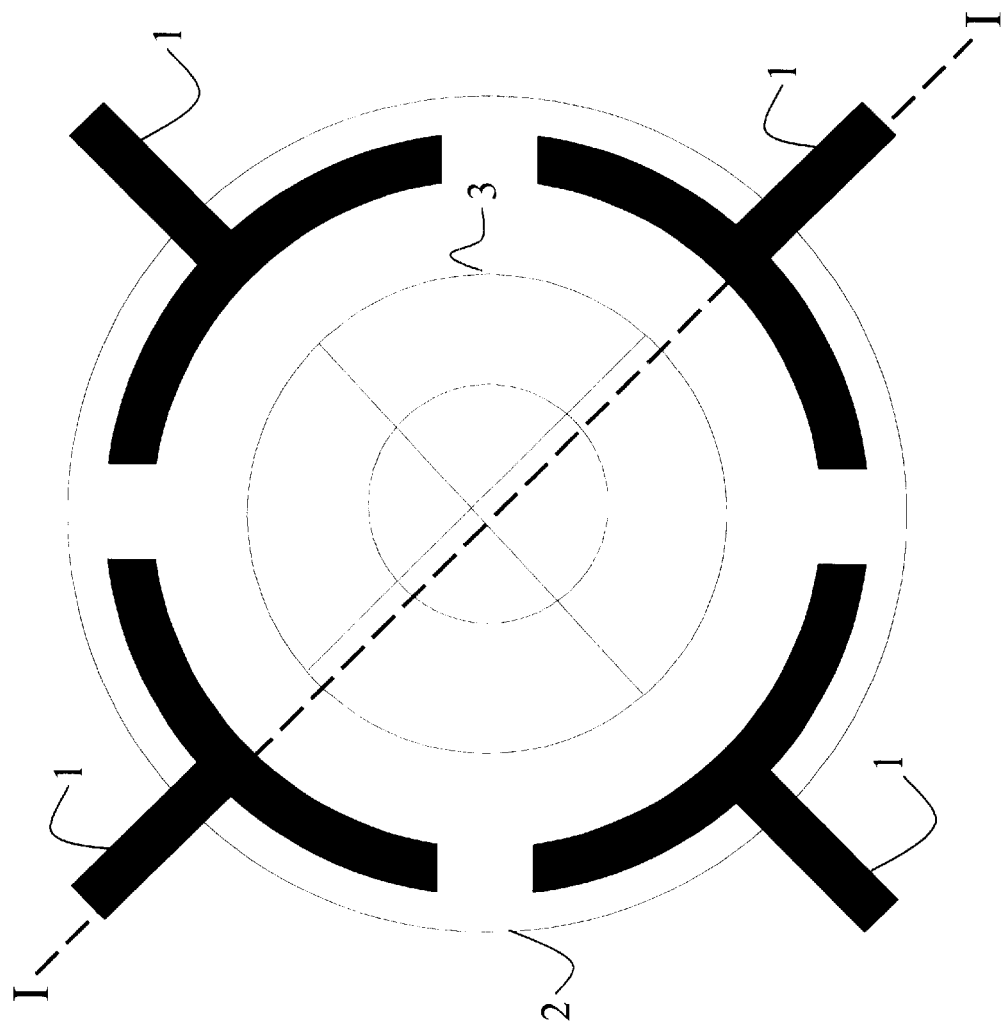

ELECTROCHROMIC DEVICE

Priority is claimed under 35 U.S.C. §119(a) for the filing of Swedish Application No. 0100747-5 on Mar. 7, 2001, and under 35 U.S.C. §119(e) for the filing of U.S. Provisional Application No. 60/276,105 on Mar. 16, 2001.

FIELD OF THE INVENTION

The present invention relates to electrochromic devices, and in particular to electrochromic devices comprising an electrically conducting, electrochromic element and at least one layer of solidified electrolyte, and two or more electrodes for connection to an electric voltage supply. The invention also relates to addressing of an electrochemically active element.

BACKGROUND OF THE INVENTION

Electrochromic materials exhibit colour changes or changes in optical density as a result of electrochemical reduction and/or oxidation reactions. An electrochromic material can either be present as a solid, or exist as molecular, neutral or ionic species in an electrolyte solution. These materials have been used for the creation of electrochromic cells, where the passage of electric charge causes colour changes in the materials. Electrochromic cells are used in electrochromic devices of different kinds, and two principal categories of these devices can be distinguished. The two-categories differ from each other mainly in the arrangement of the elements of the electrochromic cell.

The first category of electrochromic devices utilises a sandwich construction, and is used in applications such as automobile windows, building windows, sunglasses, large billboards, mirrors with variable reflectance, sunroofs etc. In this type of electrochromic device, continuous layers of electrochromic material and electrolyte (as well as other layers of e.g. ion reservoir material) are confined between two electrodes that completely cover the layers of electrochromic material and electrolyte. For the electrochromic device to be of use, at least one of said electrodes has to be transparent to let light through the device. This requirement is met in the prior art through the use of electrode materials such as indium-doped tin oxide (ITO), tin dioxide or fluorine-doped tin dioxide. The electrochromic-materials used in these applications vary, but are often based on heavy metal oxides such as $WO_3$ or conducting polymers such as polyaniline or polypyrrole. The conducting, electrochromic polymer poly-(3,4-ethylendioxythiophene) (PEDOT) has attracted much study, and sandwich devices incorporating this polymer have been realised.

The second category of electrochromic devices aim at providing an electrically updateable display for realisation on a flexible support, U.S. Pat. No. 5,754,329 describes such a display, in which the electrodes of the electrochromic device are placed in one and the same plane, contacting a layer of electrochromic material for the generation of local colour effects at the interface between the electrochromic material and the electrodes. U.S. Pat. No. 5,877,888 represents a further development of this device, describing a two-sided display. However, the arrangement of the component layers of the electrochromic device is similar to that of the device of the U.S. Pat. No. 5,754,329 patent, considering that the electrodes on either side of the display support contact electrochromic material only, and the generation of electrochromic effects is confined to the area of the electrodes. The electrochromic materials that are used in these devices are described in detail in U.S. Pat. No. 5,812,300.

The electrochromic devices of the prior art have limitations in that any colour change effects are essentially confined to the area of electrodes. Prior art devices offer no versatility in the addressing of electrochromic material. As a result, the prior art suffers drawbacks as to the potential for generating innovative and versatile electrochromic devices. Furthermore, the materials used in electrochromic devices of the prior art suffer drawbacks as to environmental friendliness, processability and economy. Thus, there is a demand for electrochromic devices that improve the art and do not suffer the disadvantages of the prior art.

SUMMARY OF THE INVENTION

An object of the present invention is to meet this demand, by providing an electrochromic device that allows the electrochromic material to be addressed via the electrolyte, so that the electrode architecture is not limited by the requirement that the electrodes of the voltage supply be in direct electrical contact with the electrochromic material for electrochromic effects to occur. In embodiments of the invention, the electrochromic material used should exhibit colour change at locations distant from the immediate area of the electrodes, in response to an electric field within the electrolyte between the electrodes.

Another object of the present invention is to advance the art of electrochromic devices, by providing an electrochromic device, for example an electrochromic display, which utilises a combination of materials that are simple to use, compatible with a flexible support such as a sheet or web of a polymer or of paper and with conventional printing methods, and that cause as few environmental problems as possible upon manufacture, use, disposal and destruction of the device.

Another object of the present invention is to provide an electrochromic device, in which the utilised electrochromic material is in itself electrically conducting.

Another object of the present invention is to provide a combination of electrochromic systems for displays of more than one colour.

Still another object of the invention is to provide a bi-stable electrochromic display, wherein the induced colour changes remain after removal of the applied potential difference.

A further object of the invention is to provide a process for the manufacture of such an electrochromic device, which process utilises conventional printing methods or other deposition techniques that are well known, relatively unexpensive and easily scaled up.

The aforementioned and other objects are realised by the electrochromic device according to the present invention. Thus, a supported or self-supporting electrochromic device is provided, comprising:

at least one electrochromic element comprising (i) at least one material that is electrically conducting in at least one oxidation state and (ii) at least one electrochromic material, wherein said materials (i) and (ii) can be the same or different, at least one layer of a solidified electrolyte which is in direct electrical contact with said electrochromic element, and at least two electrodes adapted to be electrically connected to a voltage supply so as to create a difference in potential therebetween;

each of said electrodes being in direct electrical contact with at least one of said electrolyte layer(s) and not in direct electrical contact with said electrochromic element.

The electrochromic device according to the invention is particularly advantageous in that a display can be realised were the electrodes only cover a fraction of the solidified electrolyte with which they are in direct electrical contact, offering a substantial freedom when designing devices. Thus, in preferred embodiments of the invention, the electrodes cover between 0,01% and 50% of the area of the electrolyte layer(s), for example between 0,01% and 25%, or between 0,01% and 10%.

In one embodiment of the invention, an electrochromic device is provided, in which-the electrodes are arranged side by side in a plane. The electrodes then form an electrode layer, which can be deposited on a support in a conventional manner, and patterned in any desirable fashion. This is of special interest in the realisation of electrochromic displays. Also, when this arrangement of electrodes is used, the connections formed with the electrolyte are preferably made with only one layer of said electrolyte.

The invention provides an electrochromic device, where the external circuit supplying voltage to the device is not in electrical contact with the electrochromic element. The voltage applied to the electrodes induces an electric field in the electrolyte, which then surprisingly gives rise to an electrochromic colour change in the electrochromic element. This surprising possibility of addressing an electrochromic element through an electrolyte opens up many applications for the realisation of electrochromic devices. Thus, the electrochromic device according to the invention is advantageous in that it has no need for transparent electrode materials, since colour changes can take place distant from the electrodes. This offers the possibility of realising display embodiments where the electrodes are hidden on the side or on the back of the display. This feature also gives the user the freedom to use the electrodes as part of the device, for example as frames or contour lines in a display. Thus, possible embodiments of the invent,on include a completely transparent display that can be realised without the need for transparent electrodes.

In some embodiments of the invention, the electrolyte is in the form of a continuous layer to which the electrodes are applied, giving rise to a dynamic device in which application of voltage results in a colour change that is reversed upon removing the voltage. In other embodiments of the present invention, an electrochromic device is provided in which the electrolyte is patterned between electrodes The conduction of ions in this device is then interrupted, so that the application of voltage to the electrochemical cell of the device results in reduction and oxidation reactions that are not reversed upon removing the voltage. Thus, bi-stable switching between states is made possible by these accumulator-like properties of such embodiments of the device.

In embodiments of the invention, an electrochromic device is provided, which comprises at least one further electrochromic material to complement said electrochromic material in the electrochromic element. This makes it possible to realise devices with more than one colour, with for example one colour-generating oxidation reaction and one colour-generating reduction reaction taking place simultaneously at different locations in the device, As a further example, redox reactions giving rise to different colours at the same location, but at different applied voltages, can be designed. This further electrochromic material can be provided within the solidified electrolyte or within the electrochromic element, which then for example comprises an electrochromic redox pair.

Embodiments of the device of the invention may also comprise a redox active material which does not in itself give rise to electrochromic effects. Such a material may fulfil any or both of the following two roles: (i) In some arrangements of the electrochromic device according to the invention, the electrochromic material of the entire volume of the electrochromic element can not be completely oxidised or reduced in the absence of a complementary redox reaction; rather, only part of the material will be oxidised or reduced, respectively. Thus, the addition of a further redox active material makes it possible to fully oxidise or reduce the electrochromic material. (ii) The electrochromic material may be sensitive to over-oxidation, occurring at too high an applied voltage, and destroying the electrochromic material rendering it useless. A further redox active material comprised in the device may serve the function of protecting the electrochromic material from such over-oxidation, through restricting the electric polarisation in the electrochromic element to a value below a threshold value. At this threshold value, the protective, further redox active material will instead be oxidised, protecting the electrochromic material from a polarisation that would otherwise destroy it. As is readily appreciated by the skilled man in the light of what is discussed above, a suitably chosen redox active material, exhibiting electrochromic effects, could serve the function of providing a complementary, colour-generating reaction, at the same time as it provides either or both of the beneficial effects of protection against over-oxidation and enabling of complete reduction/oxidation of the first electrochromic material.

In some preferred embodiments of the invention, the electric field(s) causing the colour changes in the electrochromic element are generated in a dynamic fashion, so that displays with animated effects can be realised. Preferably, more than two individually addressed electrodes are used, and these can be positioned in a tailored manner so as to create animated elements in the display. Different and varying potentials can be applied to these electrodes, giving rise to variable electric fields in the electrolyte, by way of which the animated effects are controlled. Especially interesting is the fact that these animated effects can be realised without the need for individually addressable pixels or segments. This possibility to create dynamic effects (dynamic dedicated displays) by superposition of electric fields from several electrodes is only possible because of the fact that there is no direct electrical contact of the electrodes with the electrochromic element, but rather an ionic contact with the electrochromic element via the electrolyte, and the fact that only a fraction of the electrolyte is covered with electrodes.

Another way to generate dynamic or variable colouring effects in the electrochromic device of the invention is to use a combination of different solidified electrolytes, having different ionic conductivities. Parts of an electrochromic element, or some of a plurality of electrochromic elements, may then be in direct electrical contact with such different electrolytes. Electrochromic areas that are in contact with an electrolyte having higher ionic conductivity will colour/decolour faster than electrochromic areas that are in contact with an electrolyte having a lesser ionic conductivity, which makes possible different combinations of image elements with different colouring and decolouring speeds.

The electrochromic device according to the invention is also particularly advantageous in that it can be easily realised on a support, such as polymer film or paper. Thus, the layers of different component materials can be deposited on the support by means of conventional printing techniques such as screen printing, offset printing, ink-jet printing and flexographic printing, or coating techniques such as knife coating, doctor blade coating, extrusion coating and curtain coating, such as described in "Modern Coating and Drying Technology" (1992), eds E D Cohen and E B Gutoff, VCH Publishers Inc, New York, N.Y., USA. In those embodiments of the invention that utilise an electrochromic polymer (see below for materials specifications), this material can also be deposited through in situ polymerisation by methods such as electropolymerisation, UV-polymerisation, thermal polymerisation and chemical polymerisation. As an alternative to these additive techniques for patterning of the layers, it is also possible to use subtractive techniques, such as local destruction of electrochromic material through chemical or gas etching, by mechanical means such as scratching, scoring, scraping or milling, or by any other subtractive methods known in the art. An aspect of the invention provides such processes for the manufacture of an electrochromic device from the materials specified herein.

However, the invention is not limited to supported devices, as the layers of electrochromic material, electrolyte and the electrodes can be arranged in such a way that they support each other. An embodiment of the invention thus provides for a self-supporting device.

According to a preferred embodiment of the invention, the electrochromic device is encapsulated, in part or entirely, for protection of the device. The encapsulation retains any solvent needed for e g the solidified electrolyte to function, and also keeps oxygen from disturbing the electrochemical reactions in the device. Encapsulation can be achieved through liquid phase processes. Thus, a liquid phase polymer or organic monomer can be deposited on the device using methods such as spray-coating, dip-coating or any of the conventional printing techniques listed above. After deposition, the encapsulant can be hardened for example by ultraviolet or infrared irradiation, by solvent evaporation, by cooling or through the use of a two-component system, such as an epoxy glue, where the components are mixed together directly prior to deposition. Alternatively, the encapsulation is achieved through lamination of a solid film onto the electrochromic device. In preferred embodiments of the invention, in which the layers of the electrochromic device are arranged in a sheet-like configuration, the support of the device can function ads the bottom encapsulant. In this case encapsulation is made more convenient in that only the top of the sheet needs to be covered with liquid phase encapsulant or laminated with solid film.

In some embodiments of the invention, the support is itself soaked in electrolyte, so that layers of support material and electrolyte coincide. It is then possible to deposit electrically conducting, electrochromic material on one side of the support, which in this case typically is paper. On the other side, an electrode layer can be deposited, which is in direct electrical contact with the electrolyte layer soaked into the support. This electrode layer can be made sparse enough to allow for an interspersing layer of electrochromic material on this side of the support also. Thus, it is possible to easily realise a two-sided display (this aspect of the invention is further explored in relation to FIG. 5 below). Alternatively, the device according to the invention may comprise one or more electrochromic element(s) that are completely surrounded by electrolyte, which is then preferably transparent on at least one side of the element(s). The other side may be the electrolyte-soaked support mentioned above.

According to the invention, the electrodes are in direct electrical contact with the electrolyte. In cases where there are more than one layer of electrolyte, all electrodes need not be in contact with the same layer.

As discussed above, the addressing of an electrochromic element through an electrolyte opens up many possibilities for the realisation of electrochromic devices. However, this principle may be generally used in any circumstance where there is a need for addressing, or applying an electric voltage to, an electrochemically active element. The present invention thus, in a further aspect, provides a method for the application of an electric voltage to an electrochemically active element in direct electrical contact with an electrolyte, wherein electrodes of a voltage supply are brought into direct electrical contact with the electrolyte only, so as to generate an electric field in the electrolyte, which electric field in turn gives rise to a voltage induced within the electrochemically active element through its interface with the electrolyte.

The electrochemically active element in this aspect of the invention may be any element comprising an electrochemically active material, the properties of which may be altered through the application of an electric voltage. Thus, the electrochemically active element may certainly be an electrochromic element, such as in the aspects of the invention discussed above, but the method according to this aspect of the invention is equally applicable to such electrochemically active elements as transistor channels and actuators ("micromuscles"). Furthermore, the method of applying a voltage via an electrolyte in the indirect fashion of this aspect of the invention offers possibilities of designing and addressing novel electrochemically active elements with a range of different functionalities.

Further objects and purposes of the present invention will be clear from the following drawings and detailed description of specific embodiments thereof. These specifications and drawings are intended as illustrations of the invention as claimed, and are not to be seen as limiting in any way,

BRIEF DESCRIPTION OF THE DRAWINGS

FIG. 4A is a schematic side-view of a second embodiment of the present invention, in which the electrodes are in direct electrical contact with the electrolyte, and in which the electrolyte forms a patterned layer and the electrochromic element forms a continuous layer.

FIG. 6 is another schematic side-view of the embodiment shown in FIG. 5, in which each of the two sides of the paper support soaked in electrolyte are provided with a patterned layer of electrochromic material.

FIG. 8A is a schematic top-view of another embodiment of the present invention, in which a circular, segmented electrochromic element is covered with a layer of electrolyte. Four electrodes are in direct electrical contact with the electrolyte layer.

DETAILED DESCRIPTION OF PREFERRED EMBODIMENTS

Definitions

Figure 1:
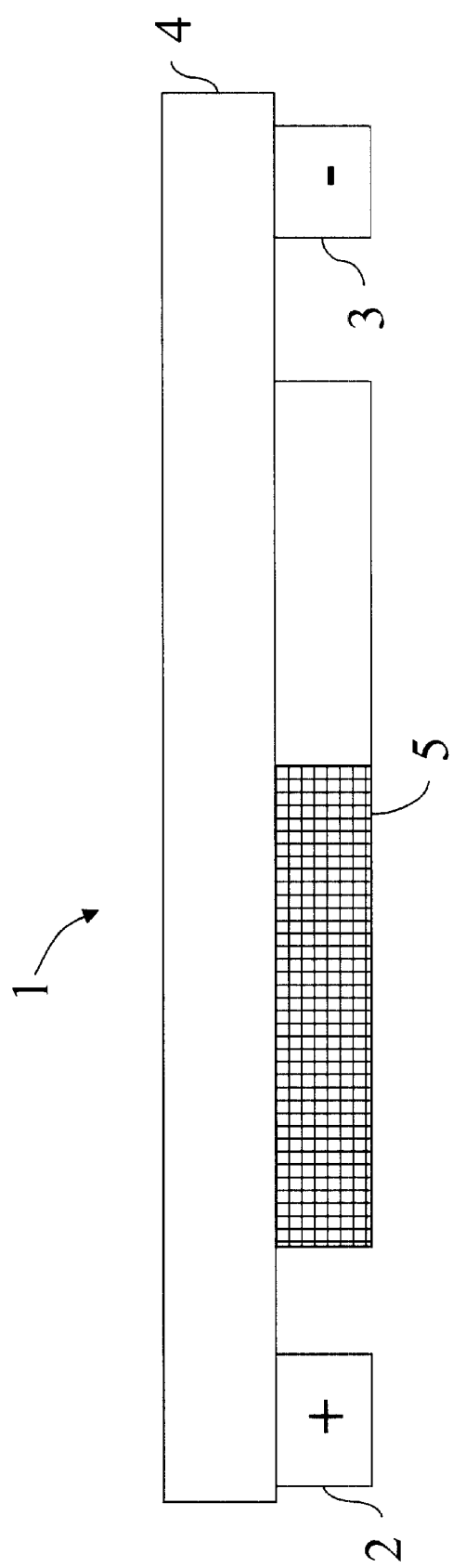
FIG. 1 is a schematic side-view of a first embodiment of the present invention, in which the electrodes are in direct electrical contact with the electrolyte, and in which both the electrochromic element and the electrolyte form continuous layers.

Electrochromic element; an "electrochromic element" in the devices of the invention is a continuous geometrical body, which can be patterned to different shapes, and is composed of one material or a combination of materials. the material(s) may be organic or inorganic, molecular or polymeric. Such an electrochromic element, whether it is composed of one material or is an ensemble of more than one material, combines the following properties: at least one material is electrically conducting in at least one oxidation state, and at least one material is electrochromic, i e, exhibits colour change as a result of electrochemical redox reactions within the material.

Solidified electrolyte: for the purposes of the invention, "solidified electrolyte" means an electrolyte, which at the temperatures at which it is used is sufficiently rigid that particles/flakes in the bulk therein are substantially immobilized by the high viscosity/rigidity of the electrolyte and that it doesn't flow or leak. In the preferred case, such an electrolyte has the proper rheological properties to allow for the ready application of this material on a support in an integral sheet or in a pattern, for example by conventional printing methods. After deposition, the electrolyte formulation should solidify upon evaporation of solvent or because of a chemical cross-linking reaction, brought about by additional chemical reagents or by physical effect, such as irradiation by ultraviolet, infrared or microwave radiation, cooling or any other such. The solidified electrolyte preferably comprises an aqueous or organic solvent-containing gel, such as gelatine or a polymeric gel. However, solid polymeric electrolytes are also contemplated and fall within the scope of the present invention. Furthermore, the definition also encompasses liquid electrolyte solutions soaked into, or in any other way hosted by, an appropriate matrix material, such as a paper, a fabric or a porous polymer. In some embodiments of the invention, this material is in fact the support upon which the electrochromic device is arranged, so that the support forms an integral part of the operation of the electrochromic device.

Electrodes: "electrodes" in devices according to the invention are structures that are composed of an electrically conducting material. Such electrodes allow the application of an external voltage to the electrolyte layer(s), whereby an electric field within the solidified electrolyte layer is sustained for a time period long enough for the desired colour changes to occur. Electrodes in preferred devices according to the present invention are distinct from the continuous layers of electrode material covering continuous sheets of electrochromic material and electrolyte that can be found in sandwich structures of the prior art. Rather, they form patterns in one or more planes in the layered structure of the present electrochromic device.

Layer: the laminate structure of the device according to the present invention consists of "layers" of different materials. These layers can be continuous or patterned, and be applied to each other (self-supporting device) or to a support (supported device). Furthermore, the term layer is intended to encompass all of the same material in the same plane, regardless whether this material is patterned or interrupted in such a way as to form discontinuous "islands" in the plane.

Direct electrical contact: Direct physical contact (common interface) between two phases (for example electrode and electrolyte) that allows for the exchange of charges through the interface. Charge exchange through the interface can comprise transfer of electrons between electrically conducting phases, transfer of ions between ionically conducting phases, or conversion between electronic current and ionic current by means of electrochemistry at an interface between for example electrode and electrolyte or electrolyte and electrochromic element, or by occurrence of capacitive currents due to the charging of the Helmholtz layer at such an interface.

Dynamic device: in certain embodiments of the invention, a "dynamic device" is provided. The colour change in the electrochromic element(s) in such a device is reversed upon removal of the external voltage.

Bi-stable device: in certain embodiments of the invention, a "bi-stable device" is provided. The effects of a colour change in the electrochromic element(s) in such a device remain after removal of the external voltage.

Colour change: when reference is made to "colour change", this is also meant to include changes in optical density or reflectance, so that "colour change" for example takes into account changes from blue to red, blue to colourless, dark green to light green, grey to white or dark grey to light grey alike.

Electrochemically active element: an "electrochemically active element" as used herein is a piece of a material comprising a material having any characterising feature that is susceptible to electrochemical alteration through changing of the redox state of said material. Such an electrochemically active element is in ionic contact with at least one electrode via a solidified electrolyte.

Materials

Preferably, the solidified electrolyte comprises a binder. It is preferred that this binder have gelling properties. The binder is preferably selected from the group consisting of gelatine, a gelatine derivative, polyacrylic acid, polymethacrylic acid, poly(vinyl-pyrrolidone), polysaccharides, polyacrylamides, polyurethanes, polypropylene oxides, polyethylene oxides, poly(styrene sulphonic acid) and poly (vinyl alcohol), and salts and copolymers thereof; and may optionally be cross-linked. The solidified electrolyte preferably further comprises an ionic salt, preferably magnesium sulphate if the binder employed is gelatins. The solidified electrolyte preferably further contains a hygroscopic salt such as magnesium chloride to maintain the water content therein.

In preferred embodiments, the electrochromic element for use in the present invention comprises, as electrochromic material, an electrochromic polymer which is electrically conducting in at least one oxidation state, and optionally also comprises a polyanion compound. Electrochromic polymers for use in the electrochromic element of the electrochromic device of the invention are preferably selected from the group consisting of electrochromic polythiophenes, electrochromic polypyrroles, electrochromic polyanilines, electrochromic polyisothianaphthalenes, electrochromic polyphenylene vinylenes and copolymers thereof, such as described by J C Gustafsson et al in Solid State Ionics, 69, 145–152 (1994); Handbook of Oligo- and Polythiophenes, Ch 10.8, Ed D Fichou, Wiley-VCH, Weinhem (1999); by P Schottland et al in Macromolecules, 33, 7051–7061 (2000);

Technology Map Conductive Polymers, SRI Consulting (1999); by M Onoda in Journal of the Electrochemical Society, 141, 338–341 (1994); by M Chandrasekar in Conducting Polymers, Fundamentals and Applications, a Practical Approach, Kluwer Academic Publishers, Boston (1999); and by A J Epstein et al in Macromol Chem, Macromol Symp, 51, 217–234 (1991). In a preferred embodiment, the electrochromic polymer is a polymer or copolymer of a 3,4-dialkoxythiophene, in which said two alkoxy groups may be the same or different or together represent an optionally substituted oxyalkylene-oxy bridge. In the most preferred embodiment, the electrochromic polymer is a polymer or copolymer of a 3,4-dialkoxythiophene selected from the group consisting of poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene), poly(3,4-butylenedioxythiophene) derivatives, and copolymers therewith. The polyanion compound is then preferably poly(styrene sulfonate). As is readily appreciated by the skilled man, in alternative embodiments of the invention, the electrochromic material comprises any non-polymer material, combination of different non-polymer materials, or combination of polymer materials with non-polymer materials, which exhibit conductivity in at least one oxidation state as well as electrochromic behaviour. Electrochromic elements comprising combinations of more than one polymer material, such as polymer blends, or several layers of electrochromic materials, wherein the different layers consist of the same material or different materials, e g one layer each of two different electrochromic polymers, are also contemplated.

For example, one could use a composite of an electrically conducting material and an electrochromic material, such as electrically conductive particles such as tin oxide, ITO or ATO particles with polymer or non-polymer electrochromic materials such as polyaniline, polypyrrole, polythiophene, nickel oxide, polyvinylferrocene, polyviologen, tungsten oxide, iridium oxide, molybdenum oxide and Prussian blue (ferric ferrocyanide). As non-limiting examples of electrochromic elements for use in the device of the invention, mention can be made of: a piece of PEDOT-PSS, being both conducting and electrochromic; a piece of PEDOT-PSS with $Fe^{2+}/SCN^-$, PEDOT-PSS being conducting and electrochromic and $Fe^{2+}/SCN^-$ being an additional electrochromic component (see below); a piece composed of a continuous network of conducting ITO particles in an insulating polymeric matrix, in direct electrical contact with an electrochromic $WO_3$-coating; a piece composed of a continuous network of conducting ITO particles in an insulating polymeric matrix, in contact with an electrochromic component dissolved in an electrolyte.

As described above, some embodiments of the invention comprise a further electrochromic material for realisation of devices with more than one colour. This further electrochromic material can be provided within the electrochromic element or the solidified electrolyte, which then for example comprises an electrochromic redox system, such as the redox pair of colourless $Fe^{2+}$ and $SCN^-$ ions on one hand, and of red $Fe^{3+}(SCN)(H_2O)_5$ complex on the other. By way of further, non-limiting example, such materials may be selected from different phenazines such as DMPA-5,10-dihydro-5,10-dimethylphenazine, DEPA-5,10-dihydro-5,10-diethylphenazine and DOPA-5,10-dihydro-5,10-dioctylphenazine, from TMPD-N,N,N',N'tetramethylphenylenediamine, TMBZ-N,N,N',N'-tetramethylbenzidine, TTF-tetrathiafulvalene, phenanthroline-iron complexes, erioglaucin A, diphenylamines, p-ethoxychrysoidine, methylene blue, different indigos and phenosafranines, as well as mixtures thereof.

As also described above, the electrochromic device of the invention may comprise a redox active material for reasons other than additional colouring effects. This redox active material may be the same or different from any of the further electrochromic materials listed immediately above. Thus, any suitable anti-oxidant or antireductant may be used, for example organic substances like vitamin C, alcohols, polyalcohols (e g glycerol) or sugars, the alcohols, polyalcohols or sugars where appropriate being present at a high pH, conjugated polymers, oligomers and single molecules; inorganic substances like salts comprising species that may be oxidised (e g $Fe^{2+}$ to $Fe^{3+}$, $Sn^{2+}$ to $Sn^{4+}$), metal clusters (e g a Cu cluster or a Fe cluster), or salts comprising species that may be reduced (e g $Fe^{3+}$ to $Fe^{2+}$, $Sn^{4+}$ to $Sn^{2+}$); metal organic complexes like ferrocenes, phthalocyanines, metalloporphyrines.

The support in some embodiments of the electrochromic device of the present invention is preferably selected from the group consisting of polyethylene terephthalate; polyethylene naphthalene dicarboxylate; polyethylene; polypropylene; paper; coated paper, e.g. coated with resins, polyethylene, or polypropylene; paper laminates; paperboard; corrugated board; glass and polycarbonate. The support is also preferably reflective.

Examples of Device Architectures

The electrochromic devices according to the invention can be designed in a variety of ways. First of all, two principal architectures will be presented with reference to FIGS. 1–4, along with a description of experiments conducted on such structures and an outline of their working principle. Note that in all of the architectures shown, the layer structure has been simplified to one layer of electrolyte and one or two layers of electrochromic elements only, whereas the electrochromic device of the invention in some embodiments very well may encompass any number of either component. Furthermore, electrochromic elements and layer(s) of electrolyte do not have to completely overlap, even though some overlap is needed for electric and/or ionic current to pass between them. Thus, electrochromic elements and layer(s) of electrolyte can be shifted sideways with respect to one another, so that, in those embodiments of the invention in which a support is used, certain areas of the support are covered with one or the other of these layers only (as well as with any necessary encapsulating material). Any number of electrodes for connection to an external voltage can be applied, though only the minimum two are described with reference to FIGS. 1–7, and four in relation to FIG. 8. Furthermore, the figures and description thereof below are not intended to limit the scope of the invention in any way, for example as to the size of the electrochromic element or elements.

Referring to FIG. 1, there is shown a schematic side-view of a first embodiment of the electrochromic device 1 according to the invention. Electrodes 2, 3 are deposited on a support (not shown). Also deposited is an electrochromic element 5, after which the electrodes and the electrochromic element are covered with a layer of a solidified electrolyte 4. The electrochromic element 5 is thus not in direct electrical contact with the electrodes, but in ionic contact with the solidified electrolyte 4. The coloration effect, induced by the application of electric voltage to the electrodes, is shown as "Colour A", this being the colour generated by the colourchanging redox reaction in the electrochromic element.

In an experiment using this architecture, the material used for the electrodes 2 and 3 was silver paste, the electrochromic element 5 was PEDOT-PSS, and the electrolyte 4 was an aqueous gel, comprising gelatine, $MgSO_4$ as conduction salt and $MgCl_2$ as hygroscopic agent. When voltage was applied to the electrodes, electrode 2 was polarised positive (anode) and electrode 3 polarised negative (cathode), whereupon an electric field was induced in the gel electrolyte. This caused oxidation of PEDOT in the area close to the cathode 3 and reduction of PEDOT in the area close to the anode 2. At an applied voltage of about 5 V, the part of PEDOT-PSS closest to the anode had been reduced, giving rise to the deep blue colour of reduced PEDOT-PSS (Colour A in FIG. 1). The oxidised volumes adjacent to the cathode 3 displayed increased transparency in the visible wavelength range. The electrochemical reactions seen depended on the internal transfer of electrons within the electrochromic element. electrons that were released in the oxidation reaction migrated to the PEDOT-PSS volume close to the anode 2, where they replenished the electrons consumed in the reduction of PEDOT-PSS occurring in this volume. The extent of the volume exhibiting colour change was dependent on the voltage applied, and will in the case of other materials also vary with the specific materials used. At 5 V in the case above, the blue colour extended over slightly more than half the layer of PEDOT-PSS. When the external voltage applied to the electrodes 2 and 3 was removed, a spontaneous discharge occurred (electrons flowed from the reduced volumes in the PEDOT-PSS to the oxidised volumes, until the original, intermediate redox state was reestablished within the electrochromic element). For maintenance of overall charge neutrality, this flow of electrons within the PEDOT was accompanied by an ion flow within the solidified electrolyte. In this embodiment, the device thus exhibits dynamic switching between coloration states characteristic of a dynamic display.

In another experiment using the architecture depicted in FIG. 1, the material used for the electrodes 2 and 3 was silver paste, the electrochromic element 5 was a piece of PEDOT-PSS coated with polyanimine (a PANIPOL™ F solution in toluene was dried on top of a piece of Orgacon™ PEDOT-PSS film), and the electrolyte 4 was an aqueous gel (Bl àgel™, provided by Apoteksbolaget, Sweden). When a voltage was applied to the electrodes, electrode 2 was polarised positive (anode) and electrode 3 was polarised negative (cathode), whereupon an electric field was induced in the gel electrolyte. This caused oxidation of the PEDOT and the polyaniline in the area closest to the cathode 3, and reduction of the PEDOT and the polyaniline in the area closest to the anode 2. When applying the voltage, different colouring effects, depending on the applied voltage, could be discerned: At voltages between 3 and 5 V, the area closest to the anode turned transparent (or pale green), due to the fact that the PEDOT remained transparent (or pale blue) and the polyaniline turned pale yellow, and the area closest to the cathode turned green, due to the fact that the PEDOT turned transparent and the polyaniline turned green. At voltages between 8 and 12 V, the area closest to the anode turned blue, due to the fact that the PEDOT turned blue and the polyaniline turned pale yellow, and the area closest to the cathode turned blue, due to the fact that the PEDOT turned transparent and the polyaniline turned blue. When applying the reversed voltages, all effects were reversed. This combination of PEDOT-PSS and polyaniline thus provides one alternative to colouring as much as possible of the electrochromic element, since both the anode and cathode areas turn blue at a high applied voltage. Other such alternatives are given below, e g with reference to FIG. 4B and to FIGS. 7A–7C.

Figure 2A:
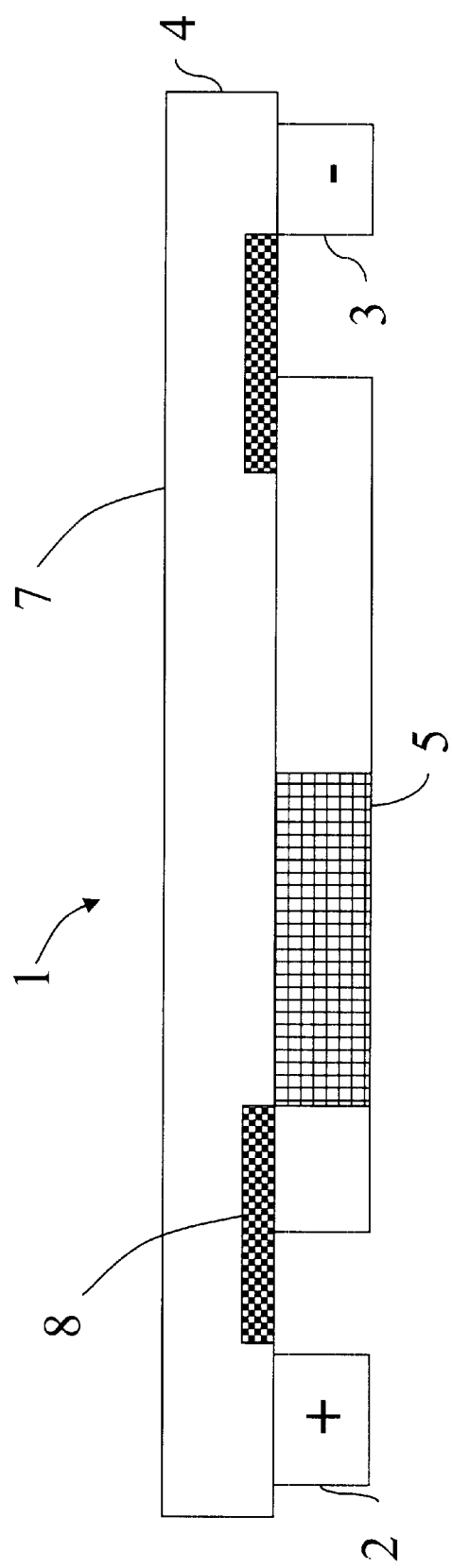
FIG. 2 is schematic side-view of a variant the embodiment shown in FIG. 1, having an electrolyte layer which comprises two electrolyte materials with different conductivities. (A) The device immediately after application of voltage. (B) The device some time afterwards.
Figure 2B:
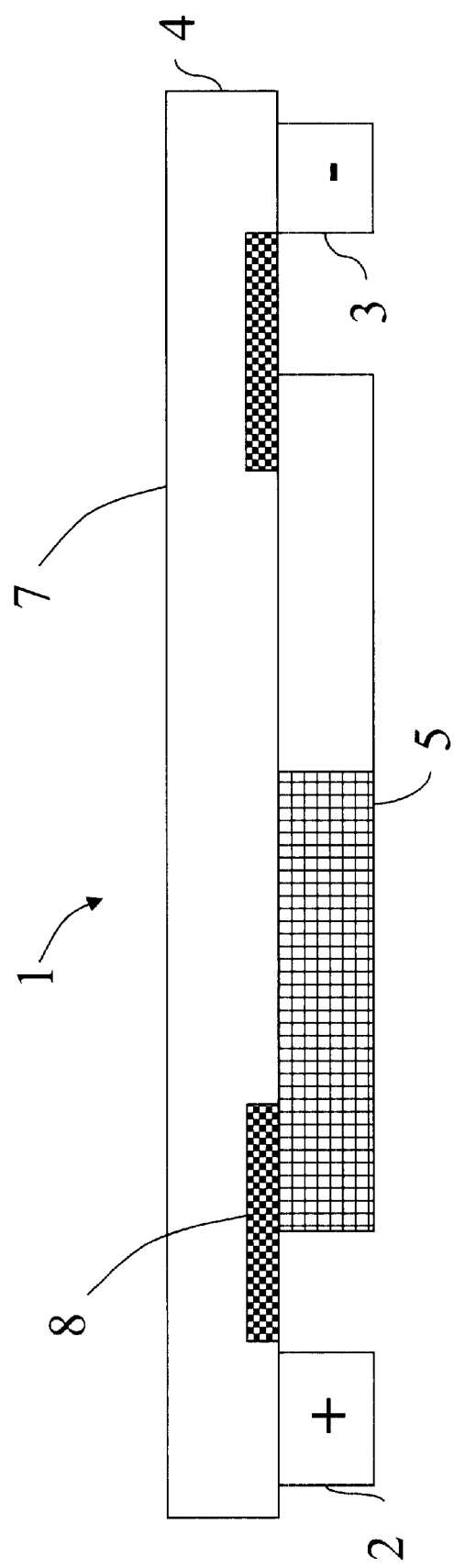

As mentioned in the general description above, it is possible to use a combination of electrolytes having different conductivity characteristics, for example in order to obtain a delay in the colouring of certain parts of the electrochromic element. A simple illustration of this is presented in FIGS. 2A and 2B, which show a device like the one described in relation to FIG. 1, with the exception that two different electrolyte materials 7 and 8 have been used to form the electrolyte layer 4. The conductivity of electrolyte material 7 is high, whereas the conductivity of electrolyte material 8 is low. FIG. 2A shows partial colouring of the electrochromic element 5 immediately after application of voltage between the electrodes 2 and 3. Only part of the electrochromic element in contact with the high conductivity electrolyte has been coloured. FIG. 2B shows the same electrochromic device some time afterwards, when the part of the electrochromic element in contact with the low conductivity electrolyte has also been coloured.

Figure 3:
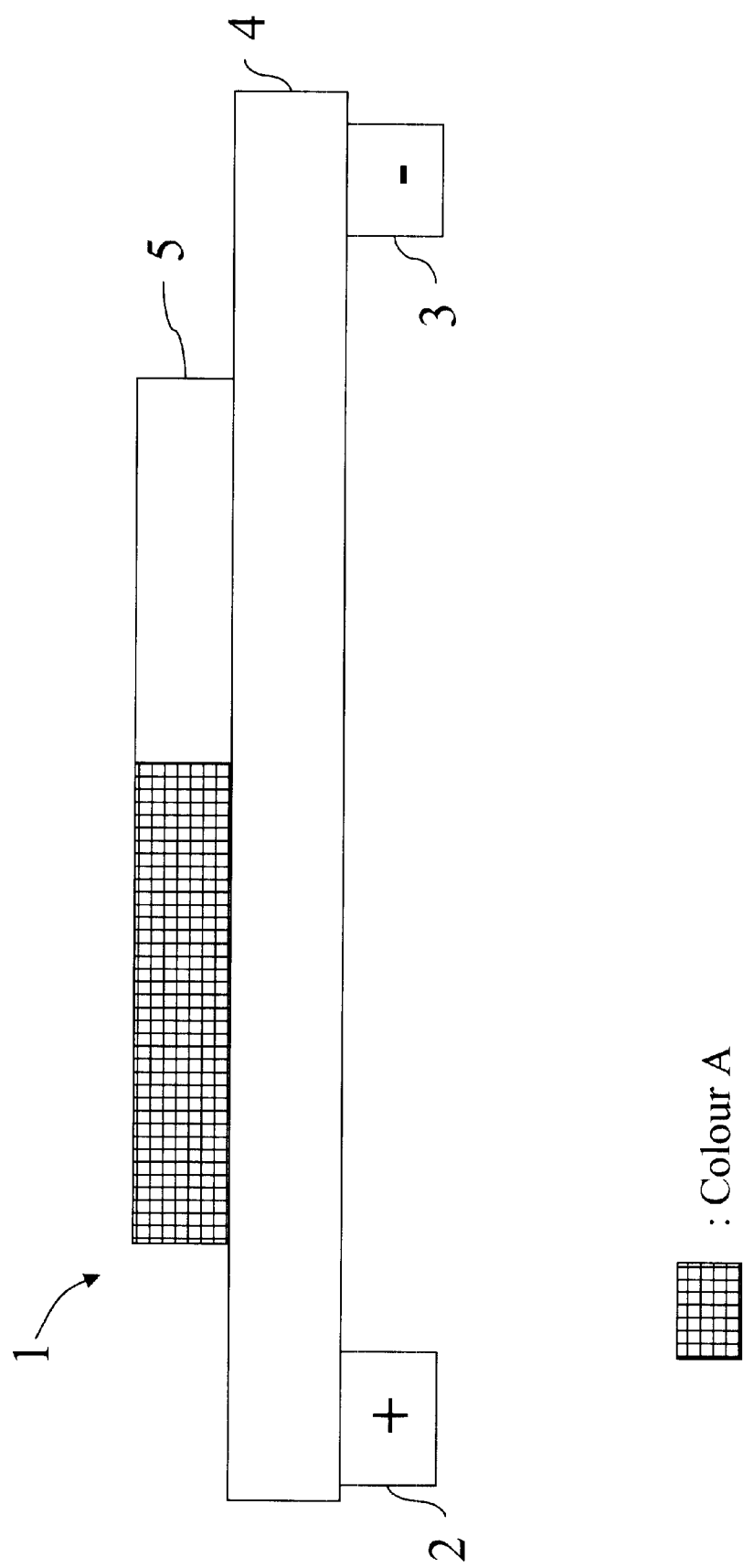
FIG. 3 is another schematic side-view of the embodiment shown in FIG. 1, presenting an alternative placement of the electrochromic element layer.

It is equally possible to deposit the electrochromic element 5 on top of the electrolyte layer 4, such as is shown in FIG. 3. In this case, the applied voltage has an identical effect on the electrochromic material, giving rise to an equivalent, dynamic, colour-generating reaction.

In FIG. 4A, a similar set-up to that in FIG. 1 is shown, except that the layer of electrolyte 4 is patterned between the electrodes, causing a disruption of the conduction of ions between the electrodes in this layer. The gap in the electrolyte layer 4 only needs to be large enough for this disruption to occur, which makes it possible to use razor-thin gaps that are almost invisible from a distance. This could be a desired feature, for example in the realisation of e g an advertisement display.

In an experiment using the architecture of FIG. 4A, the material used for the electrodes 2 and 3 was silver paste, the electrochromic element 5 was PEDOT-PSS, and the electrolyte 4 was an aqueous gel, comprising gelatine, $MgSO_4$ as conduction salt and $MgCl_2$ as hygroscopic agent. At an applied voltage of about 5 V, that part of the transparent, oxidised PEBOT-PSS which was closest to the anode had been reduced, giving rise to the deep blue colour of reduced PEDOT-PSS (Colour A in FIG. 3). The volume exhibiting colour change was sharply defined by the patterning of the electrolyte layer. Furthermore, the colour change did not disappear upon switching off of the applied voltage, since the conduction of ions in the electrolyte was prevented by the interruption of the solidified electrolyte. Therefore, the spontaneous discharge was prevented. The colour effects were observed to last for approximately one day. In electrochromic devices employing this architecture, the kind of accumulator function outlined above gives rise to a bi-stable device, the coloration of which can be reversed by reversing the applied voltage for a certain time period.

Figure 4B:
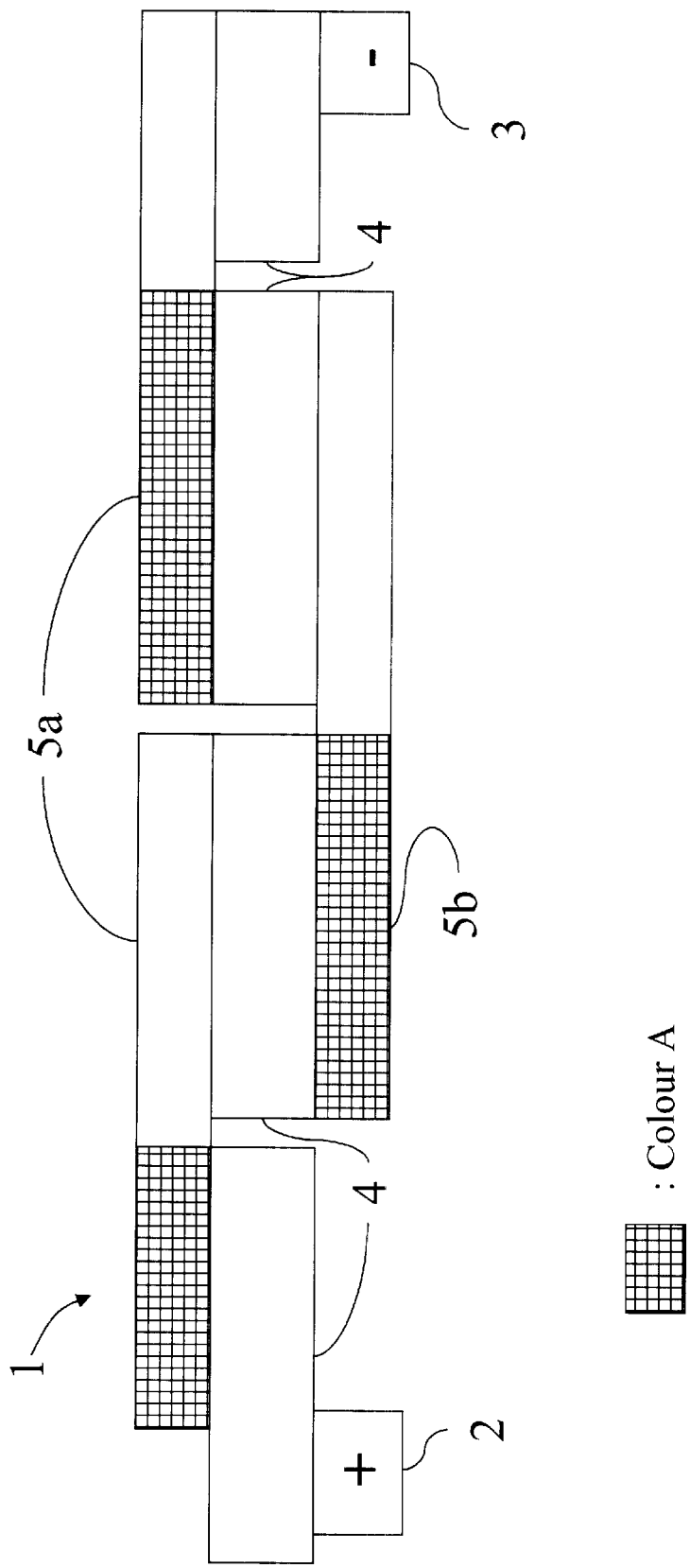
FIG. 4B is a schematic side-view of a variant of the embodiment shown in FIG. 4A, comprising a patterned electrolyte layer, on either side of which is a layer of electrochromic material, one being patterned and the other one being continuous.

Taking the design shown in FIG. 4A further, the layer(s) of electrolyte and the layer(s) of electrochromic element or elements may be patterned each individually. An embodiment which exemplifies this is shown in FIG. 4B, wherein the reference numerals correspond to the same elements of the device as in FIG. 4A. A patterning of the electrolyte layer in the manner shown in FIG. 4B will make the simultaneous colouring of many small electrochromic elements extremely efficient. Thus, the use of a large number of electrochromic elements and a suitable patterning of the electrolyte in this fashion permits updating speeds several orders of magnitude greater than those obtainable e g with a single, large electrochromic element.

Figure 5:
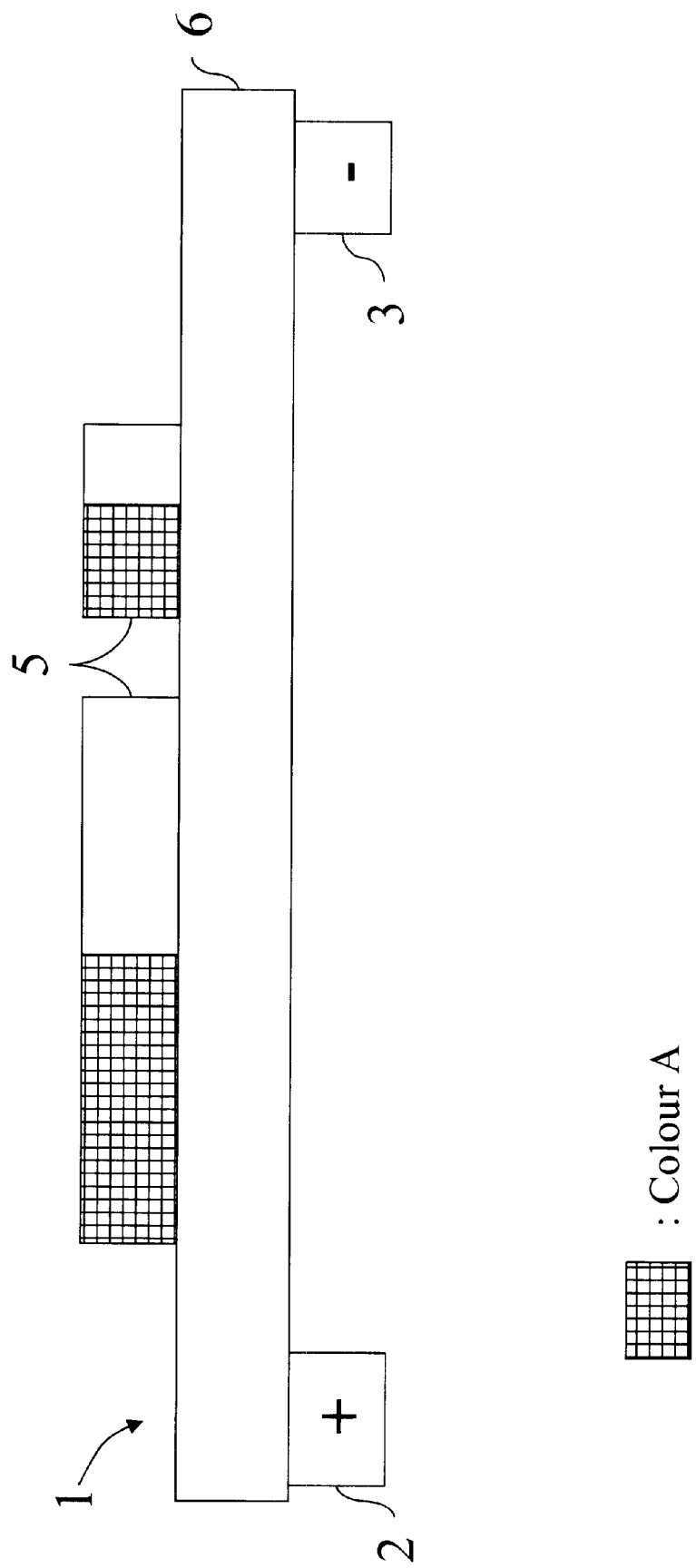
FIG. 5 is a schematic side-view of a third embodiment of the present invention, in which the electrolyte is soaked into and coincides with a paper support. On one side of the paper support, a patterned layer of electrochromic material has been deposited.

FIGS. 5 and 6 show one of the preferred embodiments of the invention, wherein the electrolyte has been incorporated in a sheet of supporting material for the device, and also illustrate the fact that layer(s) of electrochromic element or elements can be patterned, each individually thus comprising different, separated sections of the display. In the electrochromic device 1 of FIG. 5, the supporting material consists of a paper sheet 6 into which has been soaked an electrolyte solution. On one side of this paper sheet 6 electrodes 2, 3 are deposited, for example such silver paste electrodes that were used in the experiments described above. On the other side, the electrochromic element 5 is deposited. Upon application of a potential difference between electrodes 2 and 3, a colour change in the electrochromic material 5 takes place, in analogy to what has been described above.

It will be appreciated that the placing of electrochromic elements on both sides of the electrolyte-containing support sheet is equally possible within the scope of the invention, and that the opposing layers of this material can be patterned individually. An illustration of this case is shown in FIG. 4B and in FIG. 6, where electrochromic elements 5a and 5b have been placed on opposing sides of the electrolyte (FIG. 4D) or the support sheet (FIG. 6). In relation to FIG. 6, it is equally possible to place electrodes on either side of the support sheet, for example having one of the electrodes on one side and the other on the other side. In the case of more than two electrodes, these can be arranged freely, on the same or opposing sides of the sheet. Also, voltage can be applied to different combinations of electrodes, in order to create different colouring effects in the electrochromic element(s).

Figure 7A:
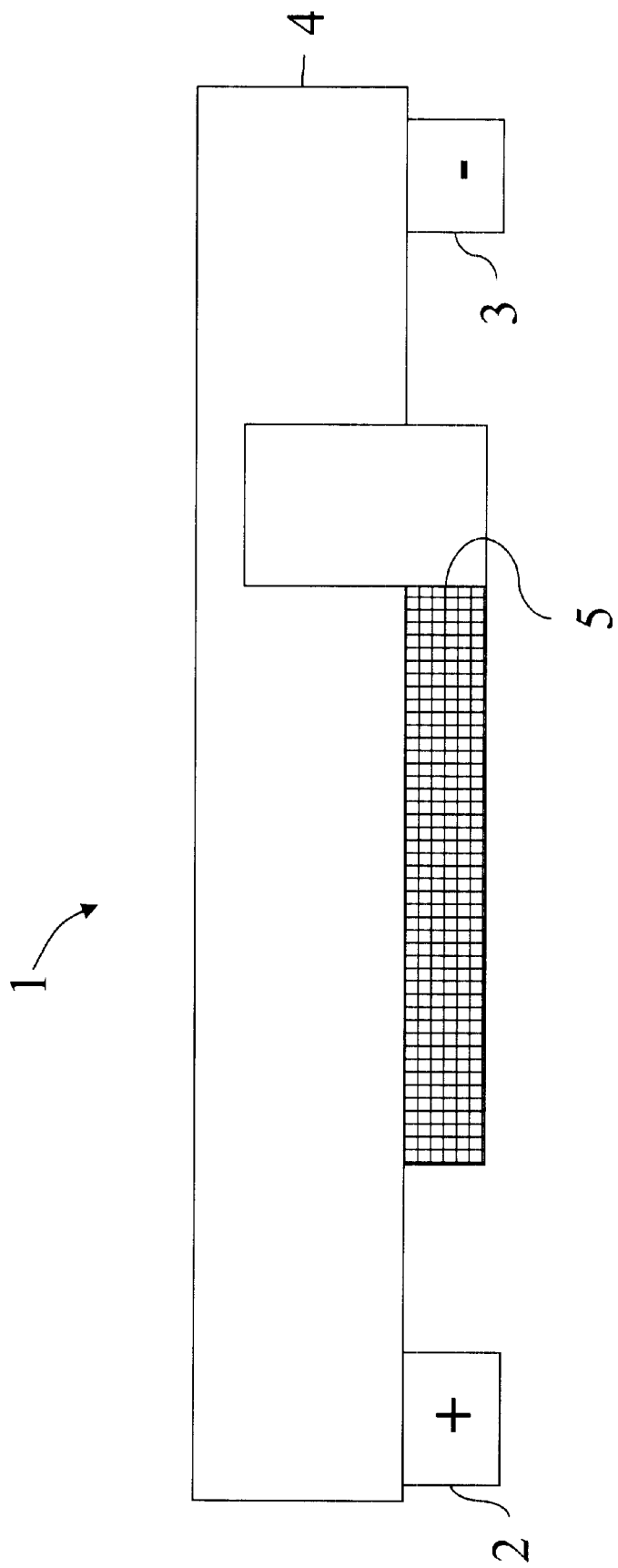
FIGS. 7A–7C are schematic side-views of further embodiments of the present invention, in which the electrochromic element or elements have been made thicker towards the cathode electrode.
Figure 7B:
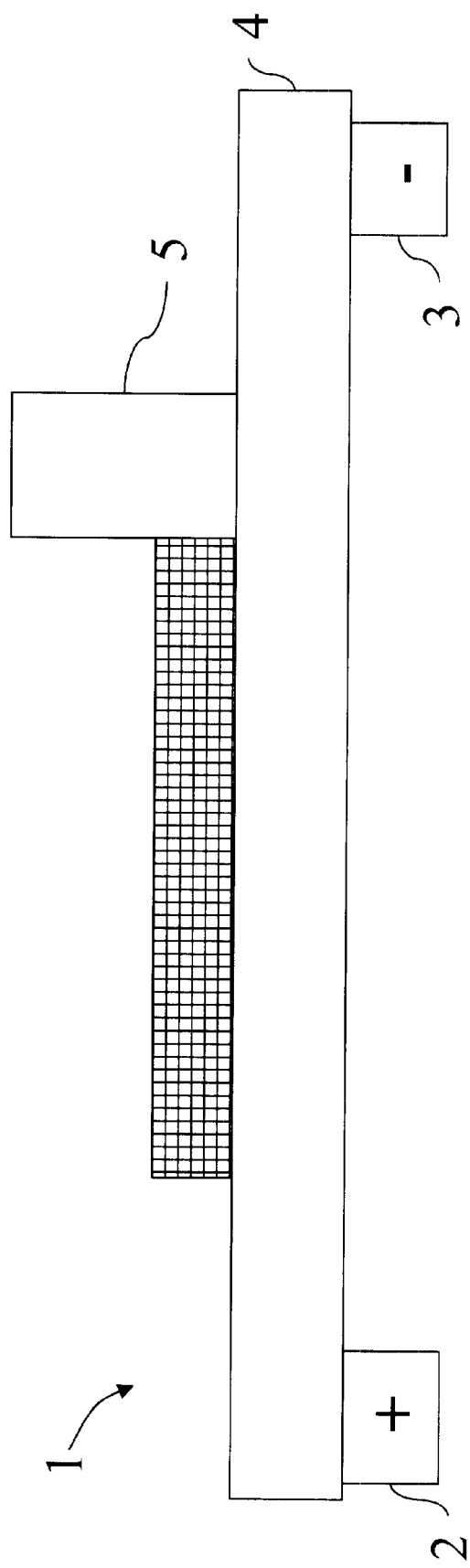
Figure 7C:
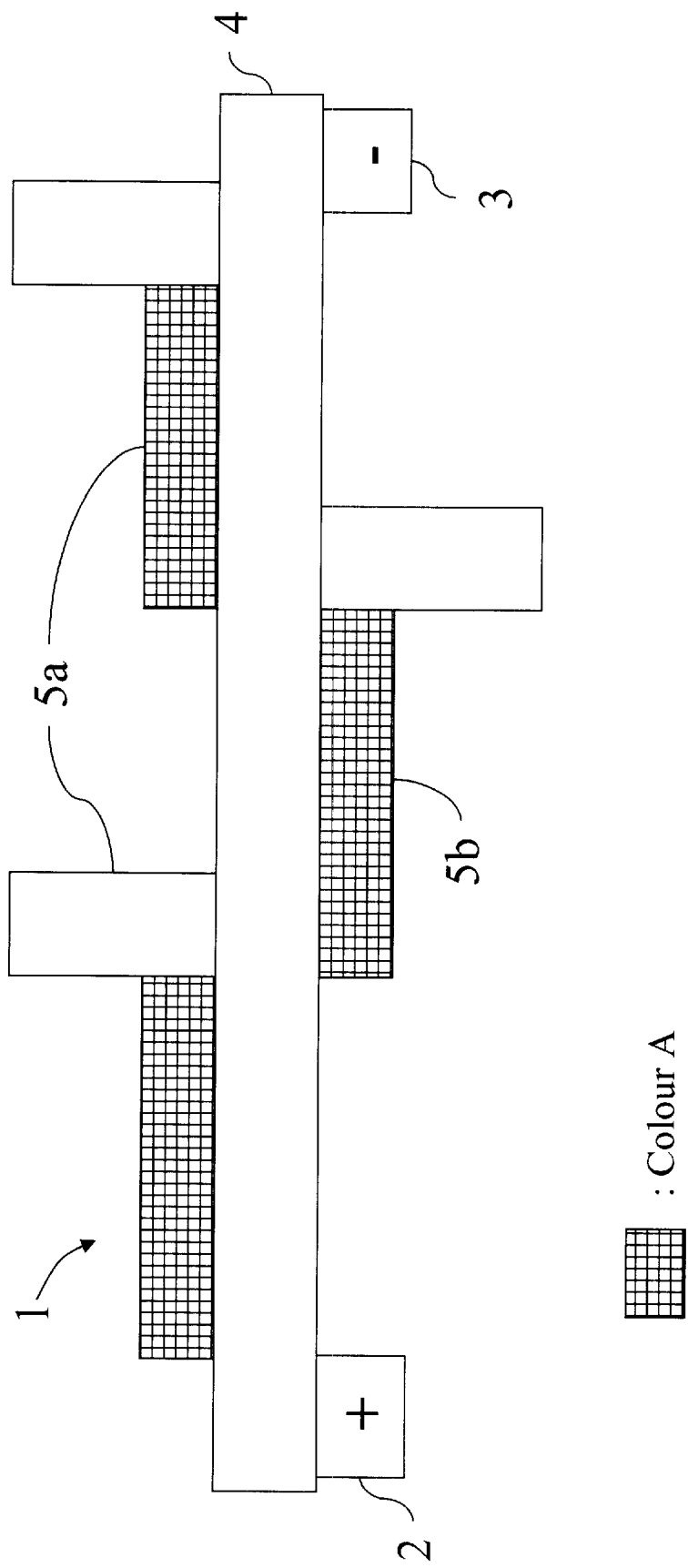
Figure 8B:
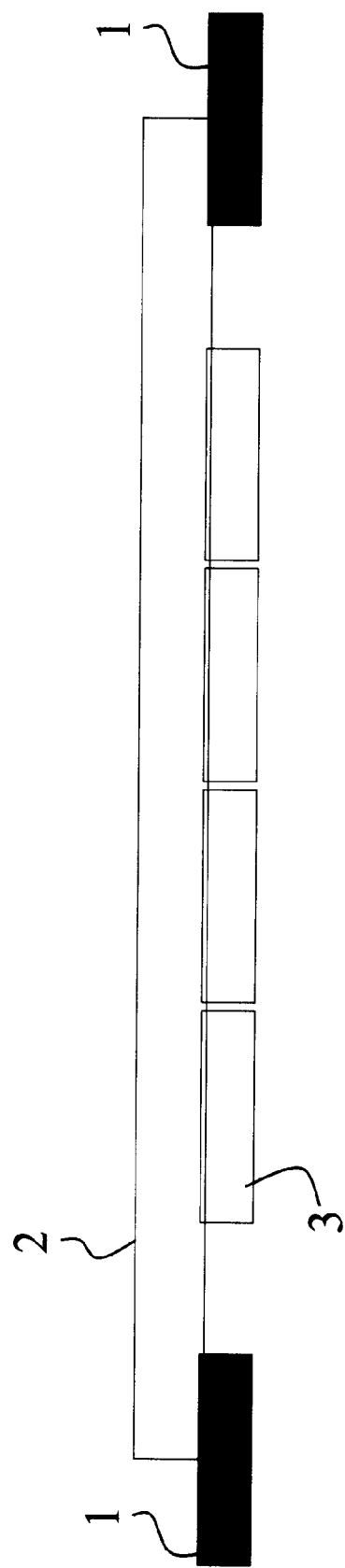
FIG. 8B is a schematic side-view showing a cross-section along the line I—I in FIG. 8A.

In the electrochromic devices of the invention, the electrochromic element(s) may be bent or unevenly thick. Some embodiments of the electrochromic device according to the invention, such as those shown in FIGS. 7A–7C, utilise such bent or unevenly thick electrochromic elements. The device architectures are generally as described above for FIG. 1 and 3. In FIG. 7A, that end of the electrochromic element which is closest to the cathode 3 is bent into the electrolyte 4. In FIG. 73, that end of the electrochromic element 5 which is closest to the cathode 3 is substantially thicker than the rest of the element, protruding from the electrolyte layer 4. In FIG. 7C, several such electrochromic elements 5a, 5b are shown, which all exhibit a protrusion or thickening on the cathode side. As mentioned before, the electrochemical reactions within the electrochromic element require an internal transfer of electrons: electrons that are released in an oxidation reaction migrate to the electrochromic element volume close to the anode 2, where they replenish the electrons consumed in the reduction of electrochromic element occurring in this volume. For a constant thickness of the electrochromic element, the ratio of reduced and oxidised areas is determined by the degree of oxidation and reduction obtained in the respective volumes of the electrochromic element (this means the area ratio is determined by the number ratio of electrons released or accepted per unit volume during oxidation and reduction, respectively). By increasing the thickness of the PEDOT-PSS slab adjacent to the negative external electrode (the volume that is oxidised), the area ratio can be modified in favour of the reduced area. As a consequence, the coloured area (colour A) makes up a larger portion of the area seen by a viewer compared to the case for FIGS. 1 and 3, for example. In this way it is possible to colour almost the complete area seen by a viewer.

The electrochromic element(s) may furthermore have any shape, e.g. disc shaped, cuboid, rectangular, flakelike with a square or rectangular profile or spherical. An embodiment of the electrochromic device, shown in FIGS. 8A and 8B, uses a segmented element of electrochromic material 3 that is disc-shaped. Covering this electrochromic element is a layer of solidified electrolyte 2, which furthermore extends beyond the electrochromic element, Around the electrochromic element disc, four electrodes 1 are evenly arrayed, so that they are in direct electrical contact with only the solidified electrolyte some distance from the electrodhromic element. Pairwise application of sinusoidal AC voltages to opposing electrodes, and proper adjustment of the phase shift between the AC voltages of the two electrode pairs, makes the colour change effect in the electrochromic element precess in a rotating fashion within each of the different segments of electrochromic material that are shown as sectors of the electrochromic element disc in FIG. 8A. Alternatively, the electrochromic element disc is continuous rather than being patterned into segments, In ever this case, the colour change will precess around the whole electrochromic element.

What is claimed is:

1. A supported or self-supporting electrochromic device comprising:

at least one electrochromic element comprising (i) at least one material that is electrically conducting in at least one oxidation state and (ii) at least one electrochromic material, wherein said materials (i) and (ii) can be the same or different, at least one layer of a solidified electrolyte which is in direct electrical contact with said electrochromic element, and at least two electrodes adapted to be electrically connected to a voltage supply so as to create a difference in potential therebetween;

each of said electrodes being in direct electrical contact with at least one of said electrolyte layer(s) and not in direct electrical contact with said electrochromic element.

2. An electrochromic device according to claim 1, in which said electrodes cover between 0,01% and 50% of the area of said electrolyte layer(s).

3. An electrochromic device according to claim 2, in which said electrodes cover between 0,01% and 25% of the area of said electrolyte layer(s).

4. An electrochromic device according to claim 3, in which said electrodes cover between 0,01% and 10% of the area of said electrolyte layer(s).

5. An electrochromic device according to claim 1, in which said electrodes are arranged side by side in a common plane.

6. An electrochromic device according to claim 1, in which said electrodes are in direct electrical contact with one layer only of said electrolyte.

7. An electrochromic device according to claim 1, in which at least one of said electrolyte layer(s) is continuous between electrodes.

8. An electrochromic device according to claim 1, in which at least one of said electrolyte layer(s) is patterned between electrodes.

9. An electrochromic device according to claim 1, in which said electrochromic material comprises an electrochromic polymer.

10. An electrochromic device according to claim 9, in which said electrochromic polymer is selected from the group consisting of electrochromic polythiophenes, electrochromic polypyrroles, electrochromic polyanilines, electrochromic polyisothianaphthalenes, electrochromic polyphenylene vinylenes and copolymers thereof.

11. An electrochromic device according to claim 10, in which said electrochromic polymer is a polymer or copolymer of a 3,4-dialkoxythiophene, in which said two alkoxy groups may be the same or different or together represent an optionally substituted oxy-alkylene-oxy bridge.

12. An electrochromic device according to claim 11, in which said polymer or copolymer of a 3,4-dialkoxythiophene is selected from the group consisting of poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene), poly(3,4-butylenedioxythiophene) derivatives, and copolymers therewith.

13. An electrochromic device according to claim 1, in which said electrochromic material comprises a polyanion compound.

14. An electrochromic device according to claim 13, in which said polyanion compound is poly(styrene sulfonic acid) or a salt thereof.

15. An electrochromic device according to claim 1, in which said solidified electrolyte comprises a binder.

16. An electrochromic device according to claim 15, in which said binder is a gelling agent selected from the group consisting of gelatine, a gelatine derivative, polyacrylic acid, polymethacrylic acid, poly(vinylpyrrolidone), polysaccharides, polyacrylamides, polyurethanes, polypropylene oxides, polyethylene oxides, poly(styrene sulphonic acid) and poly(vinyl alcohol), and salts and copolymers thereof.

17. An electrochromic device according to claim 1, in which said solidified electrolyte comprises an ionic salt.

18. An electrochromic device according to claim 1, in which said solidified electrolyte comprises an electrochromic material.

19. An electrochromic device according to claim 1, in which said electrochromic material of the solidified electrolyte and/or said electrochromic material of the electrochromic element comprises an electrochromic redox system chosen from $Fe^{2+}/SCN^-Fe^{3+}(SCN)(H_2O)_5$, 5,10-dihydro-5,10-dimethylphenazine, 5,10-dihydro-5,10-diethylphenazine, 5,10-dihydro-5,10-di-octylphenazine, N,N,N',N'-tetramethylphenylenediamine, N,N,N',N'-tetramethylbenzidine, tetrathiafulvalene, phenanthroline-iron complexes, erioglaucin A, diphenylamines, p-ethoxychrysoidine, methylene blue, indigos and phenosafranines, as well as mixtures thereof.

20. An electrochromic device according to claim 1, which is self-supporting.

21. An electrochromic device according to claim 1, which is provided with a support.

22. An electrochromic device according to claim 21, in which said support is selected from the group consisting of polyethylene terephthalate, polyethylene naphthalene dicarboxylate, polyethylene, polypropylene, polycarbonate, paper, coated paper, resin-coated paper, paper laminates, paperboard, corrugated board and glass.

23. An electrochromic device according to claim 22, in which said support is reflective.

24. An electrochromic device according to claim 21, in which said support is reflective.

25. An electrochromic device according to claim 1, in which said voltage supply is operative to generate a potential difference between electrodes that is variable over time.

26. A process for the manufacture of a supported electrochromic device comprising:

at least one electrochromic element comprising (i) at least one material that is electrically conducting in at least one oxidation state and (ii) at least one electrochromic material, wherein said materials (i) and (ii) can be the same or different, at least one layer of a solidified electrolyte which is in direct electrical contact with said electrochromic element, and at least two electrodes adapted to be electrically connected to a voltage supply so as to create a difference in potential therebetween, each of said electrodes being in direct electrical contact with at least one of said electrolyte layer(s) and not in direct electrical contact with said electrochromic element; which process comprises deposition of said electrochromic element, layer(s) of solidified electrolyte and electrodes onto a support.

27. A process according to claim 26, wherein said electrochromic element, layer(s) of solidified electrolyte and/or electrodes are deposited by means of printing techniques.

28. A process according to claim 27, in which device said electrochromic material comprises an electrochromic polymer, which process comprises deposition of said polymer on a support through in situ polymerisation.

29. A process according to claim 27 comprising patterning of said electrochromic element using a subtractive method.

30. A process according to claim 26, wherein said electrochromic element, layer(s) of solidified electrolyte and/or electrodes are deposited by means of coating techniques.

31. A process according to claim 30, in which device said electrochromic material comprises an electrochromic polymer, which process comprises deposition of said polymer on a support through in situ polymerisation.

32. A process according to claim 30 comprising patterning of said electrochromic element using a subtractive method.

33. A process according to claim 26, in which device said electrochromic material comprises an electrochromic polymer, which process comprises deposition of said polymer on a support through in situ polymerisation.

34. A process according to claim 26 comprising patterning of said electrochromic element using a subtractive method.

35. A process according to claim 34, in which said patterning is performed through chemical etching.

36. A process according to claim 34, in which said patterning is performed through gas etching.

37. A process according to claim 34, in which said patterning is performed by mechanical means, comprising scratching, scoring, scraping and milling.

38. A process according to claim 26 comprising patterning of said electrochromic element using a subtractive method.

39. A method for the application of an electric voltage to an electrochemically active element in direct electrical contact with an electrolyte, wherein electrodes of a voltage supply are brought into direct electrical contact with the electrolyte only, so as to generate an electric field in the electrolyte, which electric field in turn gives rise to a voltage induced within the electrochemically active element through its interface with the electrolyte.

40. A method according to claim 39, wherein the electrochemically active element comprises an electrochromic element.

41. A method according to claim 39, wherein the electrochemically active element comprises an electrochemical actuator.

42. A method according to claim 39, wherein the electrochemically active element comprises a transistor channel.

* * * * *